United States Patent [19]

Edmond

[11] Patent Number: 5,061,972

[45] Date of Patent: Oct. 29, 1991

[54] FAST RECOVERY HIGH TEMPERATURE RECTIFYING DIODE FORMED IN SILICON CARBIDE

[75] Inventor: John A. Edmond, Apex, N.C.

[73] Assignee: Cree Research, Inc., Durham, N.C.

[21] Appl. No.: 582,513

[22] Filed: Sep. 13, 1990

Related U.S. Application Data

[63] Continuation of Ser. No. 403,690, Sep. 16, 1989, abandoned, which is a continuation-in-part of Ser. No. 284,035, Dec. 14, 1988, abandoned.

[51] Int. Cl.$^5$ .............................................. H01L 29/90
[52] U.S. Cl. ........................................ 357/13; 357/17; 357/30; 357/61
[58] Field of Search ......................... 357/17, 61, 30, 13

[56] References Cited

U.S. PATENT DOCUMENTS

| | | | |
|---|---|---|---|
| 2,932,878 | 4/1960 | Jacobs ................................... | 357/17 |
| 2,937,323 | 5/1960 | Kroko et al. ......................... | 357/61 |
| 2,937,324 | 5/1960 | Kroko ................................... | 357/71 |
| 3,121,829 | 2/1964 | Huizing et al. ...................... | 357/61 |
| 3,510,733 | 5/1970 | Addamiano ......................... | 317/234 |
| 3,517,281 | 6/1970 | Mlavsky et al. .................... | 317/234 |
| 3,527,626 | 9/1970 | Brander ................................ | 357/17 |
| 3,636,618 | 1/1972 | Herzog et al. ....................... | 29/589 |
| 3,864,716 | 2/1975 | Merrin .................................. | 357/2 |
| 3,914,785 | 10/1975 | Ketchow ............................... | 357/63 |
| 4,531,142 | 7/1985 | Weyrich et al. .................... | 357/17 |

FOREIGN PATENT DOCUMENTS 58-123738 7/1983 Japan .
60-136223 7/1985 Japan .

OTHER PUBLICATIONS

W. V. Muench and I. Pfaffender; Breakdown Field in Vapor-Grown Silicon Carbide p-n Junctions; Journal of Applied Physics, vol. 48, No. 11, Nov. 77, p. 4831.
M. M. Anikin et al., "Electrical Characteristics of Epitaxial p+-n-n+ Structures Made of the 6H Polytype of Silicon Carbide"; Sov. Phys. Semicond. 22(2), Feb. 88, p. 181.
Abstract of Japan Patent No. 73,005,389; Silicon carbide rectifier—prepd by pyrolysis of silicon tetrachloride.
Abstract of Japan Patent No. 73,005,388; Semiconductor rectifier—with substrate coated with partly phosphorus or boron-diffused silicon carbide layer.
Abstract of Japan Patent No. 73,005,387; Silicon carbide rectifier—with trivalent metals diffused into each side of a flat polycrystal.
Abstract of West German Patent No. 1,244,963; Plastic encapsulated semiconducting valve or rectifier.
Abstract of Journal Article; Electrical Contacts to Beta Silicon Carbide Thin Films; Edmond et al.; North Carolina State Univ., Raleigh, NC, USA; Journal of the Electrochemical Society, vol. 135, No. 2, Feb. 1988, pp. 359-362.
Abstract of Journal Article; Fabrication of P-N Junction Diodes Using Homoepitaxially Grown 6H—SiC at Low Temperature by Chemical Vapor Deposition, Shibahara et al., Kyoto Univ, Kyoto, Japan; Jpn. J. of Apl. Phy, Part 2; Letters, vol. 26, No. 11, Nov. 1987, pp. 1815-1817.

(List continued on next page.)

Primary Examiner—Andrew J. James
Assistant Examiner—Donald L. Monin, Jr.
Attorney, Agent, or Firm—Bell, Seltzer, Park & Gibson

[57] ABSTRACT

The invention is a ultra-fast, high frequency, high temperature rectifying diode formed in silicon carbide that comprises a monocrystalline silicon carbide substrate having a sufficient carrier concentration to give the substrate a first conductivity type, a first monocrystalline epitaxial layer of silicon carbide upon the substrate and having the same conductivity type as the substrate, and a second monocrystalline epitaxial layer of silicon carbide upon the first epitaxial layer and having the opposite conductivity type from the first epitaxial layer. One of the epitaxial layers has a carrier concentration greater than the carrier concentration of the other epitaxial layer, so that the layer with the lesser concentration is predominantly depleted at reverse bias. The first and second epitaxial layers form an abrupt p-n junction.

39 Claims, 9 Drawing Sheets

OTHER PUBLICATIONS

Abstract of Jpn Article; Selective Growth and Schotky Diode Characteristics of Beta—SiC Single Crystal Films on Si (111) Substrates by Chemical Vapor Deposition; Furukawa et al.; Conf. on Solid State Devices; Jpn. Soc. of Applied Physics, Tokyo, Jpn, pp. 231–234; 1987.

Abstract of Jpn Article; Step-Controlled VPE growth of SiC Single Crystals at Low Temperatures; Kuroda et al; Comm. Engineers, Tokyo, Jpn., IEEE, Tokyo Section, Conf. on Soild State Dev. and Mat. 19th Publ. by Jpn Soc. of Apl. Sci. Tokyo, Jpn., pp. 227–230; 1987.

Abstract of Journal Article; Annealing Effects of Al/N-Type 6H SiC Rectifying Contacts; Yasuda et al.; IEEE Transactions on Elec. Dev., vol. Ed-34, No. 9, Sep. 1987, pp. 2002–2008.

Abstract of Journal Article; Characteristics of Beta-SiC films Grown From an SiHCL//3-C//3H//8-H//2 System; Furumura et al.; Elec. Commun. Jpn, Part 2, vol. 70, No. 5, May 1987, pp. 53–63; 1987.

Nishino et al.; Blue Emitting Diodes of 6H SiC Prepared by CVD; Jap. Jnl. Appl. Physics; 7/80; pp. L353–L356.

Ziegler et al.; Single Crystal Growth of SiC Substrate Material for Blue Led, IEEE Tran. on Elec. Devices 4/83; pp. 277–281.

Sze; Semiconductor Devices Physics & Technology; Copyright 85; p. 7.

FAST RECOVERY HIGH TEMPERATURE RECTIFYING DIODE FORMED IN SILICON CARBIDE

This application is a continuation of Ser. No. 07/403,690, filed Sept. 6, 1989, now abandoned; which in turn is a continuation-in-part of application Ser. No. 07/284,035, filed Dec. 14, 1988.

FIELD OF THE INVENTION

The present invention relates to rectifiers formed from semiconductor materials, and in particular relates to a high temperature high frequency rectifying diode formed in silicon carbide.

BACKGROUND OF THE INVENTION

Power electronics technology is the field of engineering which deals with the conversion, control and conditioning of electric power utilizing electronic power devices. Electronic power can be controlled as to its basic form (alternating or direct current) its effective voltage or current, its frequency and its power. In turn, the control of electric power is frequently used to maintain or achieve or regulation of some other non-electrical factors such as the speed of a motor, the temperature of a heating device or the measurement or generation of light. Control of electric power is likewise used in logic circuits which form the basis for the operation, control and applications of electronic computers.

In current technology, solid state devices have achieved nearly universal acceptance in most applications for such conversion, control and conditioning of electrical power, as well as in the computer industry. Semiconductor devices exhibit greater reliability, faster speed, higher efficiency, smaller size and often lower cost.

One basic type of solid state device is the rectifier diode. As is know to those familiar with electronic devices, diodes are the simplest kind of semiconductor device and the most straightforward use of diodes is rectification; i.e. the conversion of alternating current to direct current. Diodes act as one-way barriers to the passage of electrons in that they permit electrons to flow in one direction but bars their passage in the other direction. Thus, diodes are useful as switching devices. In electronics terminology, a diode is said to pass current in the forward direction ("forward bias") and block current in the reverse direction ("reverse bias"). The characteristics of any given diode can generally be determined by the relationship between the voltage (V) applied to the diode and the current (I).

As is further known to those familiar with electronic devices, however, current is never always completely blocked in the reverse direction. When a reverse voltage ($V_R$) is applied, a small amount of reverse current ($I_R$) will flow through the diode. The reverse current of any diode is therefore defined as the amount of current which will flow at a given reverse voltage. Under conditions of reverse voltage, however, an amount of voltage will finally be reached where the rectifying or electron blocking capability of the diode begins to break down completely. This point is called the reverse breakdown voltage ($V_{BR}$) and represents the point at which the diode undergoes avalanche multiplication or tunneling of carriers in the depletion region. At this voltage, current will increase dramatically, and if not limited, will generally destroy the diode because of the high wattage and destructive heat that results.

In general, the performance of a diode can thus be characterized using five basic characteristics:

Forward current ($I_F$), the amount of current the diode can handle without burning up;

Forward voltage ($V_F$), the voltage level necessary to produce the desired forward current level;

Reverse current ($I_R$), the amount of current that will leak through the diode at a given reverse voltage;

Reverse breakdown voltage ($V_{BR}$), the reverse voltage beyond which the flow of reverse current begins to rise very rapidly; and Reverse recovery time ($t_{rr}$), the time it takes the diode to recover from forward conduction and begin to again block reverse current.

Reverse recovery time is an important characteristic in defining the frequency of alternating current that a given diode or rectifier can handle. The higher the frequency of alternating current which is imposed on the diode, the more quickly the diode must respond in order to rectify this current.

The characteristics of any such device, of course, depend to a great degree upon the material from which the semiconductor device is formed. Different materials have different inherent electronic characteristics and capabilities, and for any given semiconductor material the quality of the devices that can be manufactured will generally depend upon the crystal structure, purity and appropriate doping that can be accomplished with such materials.

Silicon carbide has long been a candidate material for use in the manufacture of such semiconductor electronic devices. Silicon carbide has a number of characteristics which make it theoretically advantageous for such uses. These include a wide band gap, a high thermal conductivity, a low dielectric constant, a high saturated electron drift velocity, a high breakdown electric field, a low minority carrier lifetime, and a high dissociation temperature. Taken together, these properties indicate that semiconductor devices formed from silicon carbide should be operable at much higher temperatures than devices made from other semiconductors, as well as at higher speeds and higher power levels.

Nevertheless, rectifying diodes and other semiconductor electronic devices made from silicon carbide have yet to make a viable appearance in any circumstances other than laboratory research and have yet to reach their commercial potential. This lack of success results, at least partially, from the difficulty encountered in working with silicon carbide. It is an extremely hard material, often used as an abrasive. It often must be worked at extremely high temperatures under which other materials cannot be worked, and from a semiconductor standpoint, crystallizes in well over 150 polytypes, many of which are separated by rather small thermodynamic differences. For these latter reasons, production of monocrystalline thin films of silicon carbide that are necessary for certain devices, and production of large single crystals of silicon carbide which are useful as substrate material and for other applications, have remained elusive goals. Additionally, certain doping techniques which have been successfully developed for other materials have proved unsuccessful when used in connection with silicon carbide. Finally, p-n junctions appropriate for rectifying purposes have yet to make a successful practical and commercial appearance.

Recently, however, a number of developments have occurred which have successfully accomplished both single crystal bulk and thin film growth of silicon carbide. These are included in several co-pending patent applications which have been assigned to the assignee of the present invention, and the contents of which are incorporated entirely herein by reference. These include: Davis et al, "Growth of Beta-SIC Thin Films and Semiconductor Devices Fabricated Thereon," Ser. No. 113,921 Filed Oct. 26 1987; now U.S. Pat. No. 4,912,063 and Davis et al, "Homoepitaxial Growth of Alpha-SIC This Films and Semiconductor Devices Fabricated Thereon," Ser. No, 113,573, Filed Oct. 26, 1987; , now U.S. Pat. No. 4,912,064 both of which are incorporated entirely herein by reference; Palmour, "Dry Etching of Silicon Carbide," Ser. No. 116,467, Filed Nov. 3, 1987; now U.S Pat. No. 4,865,685 and Davis et al, "Sublimation of Silicon Carbide to Produce Large, Device Quality Single Crystals of Silicon Carbide," Ser. No. 113,565, Filed Oct. 26, 1987 now U.S. Pat. No. 4,866,065.

The production of an appropriate, defined p-n junction of performance quality is a fundamental step in fabricating a rectifying diodes. Accordingly, given the theoretical advantages of silicon carbide and the necessity of producing junctions to develop the devices, including rectifiers, there has been significant interest in methods of producing such junctions in silicon carbide. Most of these efforts have developed methods of producing what may be referred to as "fused" junctions. In such junctions, alternating regions of p-type and n-type silicon carbide are formed in contact with one another to form the p-n junction. Typical techniques have included melting a dopant metal directly on the surface of silicon carbide so that some of the dopant dissolves into the silicon carbide to produce an oppositely doped region, the border of which forms the p-n junction. Others use separately formed portions of p-type and n-type silicon carbide and fuse them to one another using various processes to form the p-n junction Other techniques attempt to encourage epitaxial growth of p or n-type silicon carbide upon the substrate of silicon carbide having the opposite conductivity type. A number of other methods include solvent based techniques. In a related copending application assigned to the assignee of the present invention, successful use of ion implantation techniques has been demonstrated to result in appropriate junctions; "Implantation and Electronical Activation of Dopants Into Monocrystalline Silicon Carbide," Ser. No. 113,561, Filed Oct. 26, 1987.

Similarly, a number of attempts have been made to produce successful rectifying diodes in silicon carbide. These include rectifying contacts (Schottky Diodes) between particular metals to either n or p-type silicon carbide, the fusion techniques described previously, electric arc or sputtering techniques for depositing a metal rectifying contact to silicon carbide, building stepped transitions between diode materials including silicon carbide, and using a thin layer of glassy amorphous material as an active layer in a rectifying junction device in silicon carbide.

More recently, and as set forth earlier herein, silicon carbide growth techniques using chemical vapor deposition (CVD) to produce high quality epitaxial layers of silicon carbide on both silicon and silicon carbide substrates have been demonstrated. Using these techniques, yet other researchers have attempted to successfully form rectifying diodes in silicon carbide. For example, Kuroda, et al. "Stepped Controlled VPE Growth of SIC Single Crystals at Low Temperatures", Extended Abstracts of The 19th Conference on Solid State Devices and Materials, Tokyo, 1987, pages 227-230, described their attempts to produce diodes in silicon carbide by forming adjacent p and n epitaxial layers using chemical vapor deposition techniques. In their work, Kuroda, et al. report production of a diode that has a reverse breakdown voltage of about 100 volts and a forward current of about 400 microamps at about 3 volts. Kuroda does not report any reverse recovery time, an important characteristic in a rectifying diode, and produces a graded p-n junction. As known to those familiar with such devices, the characteristics of the junction will essentially define the characteristics of the entire device. A graded junction is one in which a gradient exist between the opposite types of charge carriers (electrons and holes) which can extend for some distance across the junction including distances as great as one or more microns. Conversely, an abrupt junction exhibits rapid change from one carrier type to the other. As is further known to those familiar with such devices, one technique for determining whether a junction is graded or abrupt is the use of the measurement of the capacitance of the diode in relationship to the voltage. Generally speaking, when capacitance is plotted directly against voltage, a nonlinear relationship exists. A linear relationship will exist, however, between the reciprocal of the capacitance squared or the reciprocal of the capacitance cubed. If the relationship between the reciprocal of the capacitance squared and the voltage is nonlinear, the diode may be characterized as having an abrupt junction. Alternatively, if the relationship between the reciprocal of capacitance cubed plotted against voltage is linear, the junction can be characterized as graded. As set forth by Kuroda, the diode produced using his techniques exhibits such a graded junction.

Additionally, Kuroda's diode operates in the microamp range, a smaller amount of current capacity than would otherwise be useful in most power requirement applications. Finally, although one desirable characteristic of silicon carbide is its ability to produce blue light, for a rectifying diode a more important characteristic is operation at high temperatures and Kuroda fails to demonstrate any successful diode application at other than room temperature.

Accordingly, it is a object of the present invention to provide a rectifying diode formed in silicon carbide which can operate at high frequency, at high reverse voltage, and at high temperatures, with an abrupt junction and low forward resistance.

SUMMARY OF THE INVENTION

The rectifier of the present invention comprises a monocrystalline silicon carbide substrate having a sufficient carrier concentration to give the substrate a first conductivity type, a first epitaxial layer of silicon carbide on the substrate and having the same conductivity type as the substrate and a second epitaxial layer of silicon carbide upon the first epitaxial layer which has the opposite conductivity type from the first epitaxial layer. The first and second epitaxial layers have respective carrier concentrations that differ in magnitude by an amount sufficient so that the layer having the lesser concentration is substantially depleted in reverse bias. The first and second epitaxial layers form an abrupt p-n function between the layers.

The foregoing and other objects, advantages and features of the invention and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENT

Figures 1, 2, 3, 4:
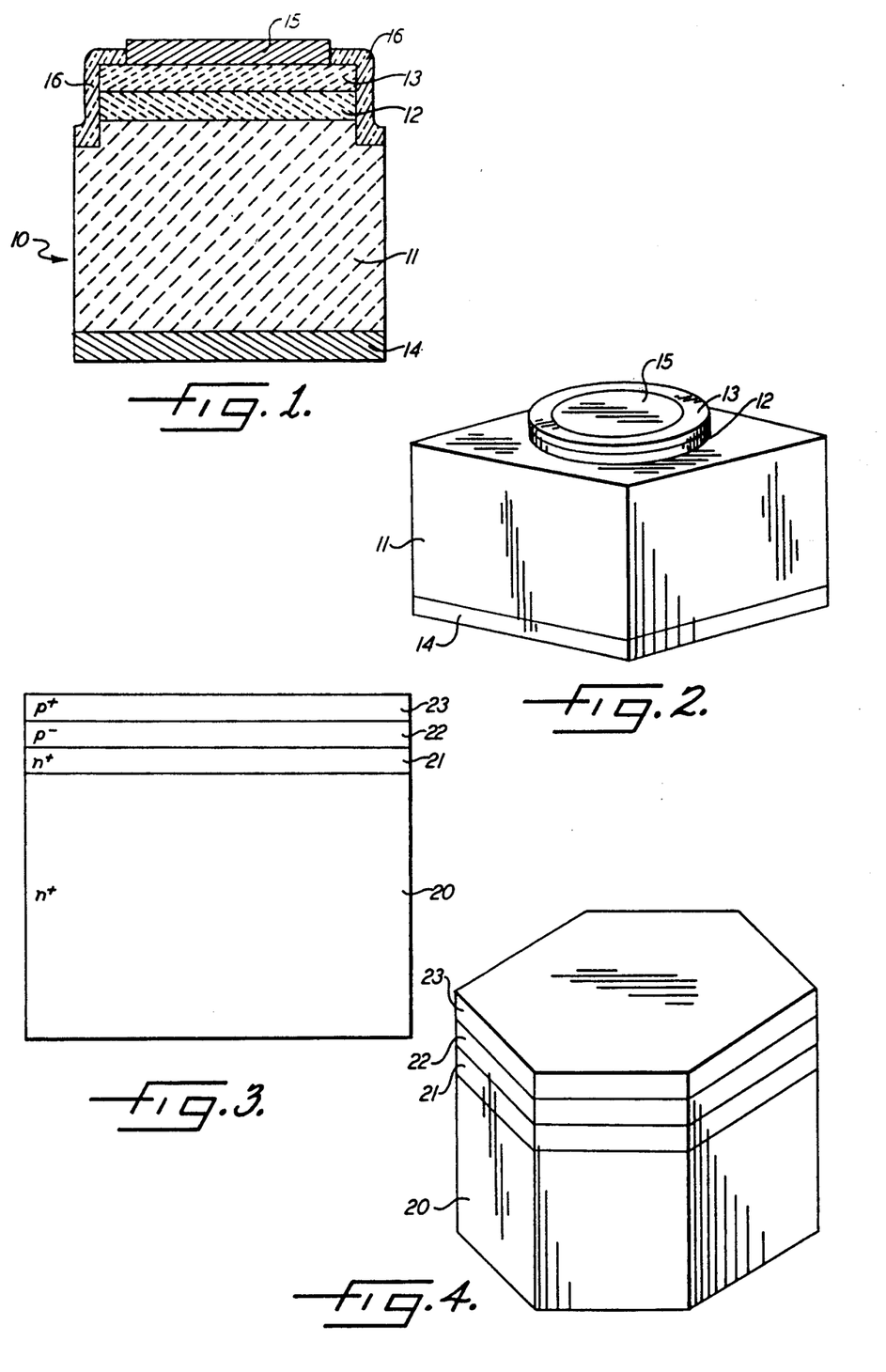
FIG. 1 is a schematic diagram of the rectifying diode of the present invention.
FIG. 2 is a perspective view of a circular mesa rectifying diode according to the present invention.
FIGS. 3 and 4 are schematic diagrams of another embodiment of the rectifying diodes of the present invention.

FIG. 1 is a schematic diagram of a first embodiment of a rectifying diode according to the present invention and generally designated at 10. The rectifying diode 10 comprises a monocrystalline silicon carbide substrate 11 which has a sufficient carrier concentration to give the substrate 11 a first conductivity type, either p or n. As is known to those familiar with electronic devices, the two types of carriers are electrons and holes. Electrons are subatomic particles and holes represent vacant positions in atoms into which electrons can move. As electrons move to such atomic positions, they leave the unfilled positions, i.e. the holes, behind so that the flow of current in any electronic device can be thought of as either the flow of electrons or of holes, with the respective flows moving in opposite directions. As is further known to those familiar with such technology, in a material such as silicon carbide, the carriers generally are introduced by dopants; i.e. atoms which have either a greater or lesser number of electrons per atom in the valance positions than does the semiconductor material itself. Dopants which have a greater number of electrons are known as donor atoms and provide extra electrons. Atoms which have fewer electrons than do the atoms of silicon carbide provide extra holes and are referred to as acceptor atoms.

A first monocrystalline epitaxial layer 12 of silicon carbide is positioned upon the substrate 11 and has the same conductivity type, either p or n, as the substrate 11 but has a carrier concentration less than the carrier concentration of the substrate 11. For example, where the substrate 11 and epitaxial layer 12 are both n-type, the greater number of carriers in the substrate 11 is conventionally designated by the shorthand notation n+, while the lesser or more normal concentration in the first epitaxial layer would be referred to simply as n.

A second monocrystalline epitaxial layer 13 of silicon carbide is positioned upon the first epitaxial layer 12 and has the opposite conductivity type from the first epitaxial layer and in this first embodiment of the invention has a carrier concentration greater than the concentration of the first epitaxial layer 12. Thus, as in the proceeding discussion of the preferred embodiment, where the substrate 11 is n+and the first epitaxial layer is n, the second layer 13 is designated as p+. The carrier concentration of the p+ epitaxial layer 13 and the carrier concentration of the n+ substrate 11 are not necessarily equivalent to one another. As used herein, the general designation p+ or n+ as compared to the general designation n merely indicates that there are more carriers in the substrate 11 than there are in the epitaxial layer 12 and that there are likewise more carriers in the second epitaxial layer 13 than there are in the first epitaxial layer 12.

As is known to those familiar with rectifying junctions, when the respective carrier concentrations of the p and n sides of the junction differ substantially—i.e. by about an order of maqnitude or more—the tendency of the carriers on each side of the junction to move and establish an equilibrium will cause more carriers from one side to move than from the other. Specifically, more carriers from the highly populated side will move to the less populated typed side. For example, if the junction is p+—n, more holes will move into the n layer than will electrons into the p+ layer. This characteristic will also exhibit itself under reverse bias conditions so that the layer with the lesser carrier concentration will b the layer that is predominantly depleted at reverse bias.

In particular embodiments, the rectifying diode generally designated at 10 will include an ohmic contact 14 to the substrate and another ohmic contact 15 to the second epitaxial layer. In particular embodiments, the ohmic contact 14 to the substrate 11 Can comprise a metal such as nickel and the ohmic contact 15 to the second epitaxial layer 13 can comprise a metal such as aluminum or a bimetallic contact, for example, formed of an aluminum alloy. In other preferred embodiments, the rectifying diode can further comprise a passivation layer 16 of silicon dioxide in the vicinity of the p-n junction. The passivation layer 16 may be thermally grown.

In the embodiment illustrated in FIG. 1, the rectifying diode has a mesa configuration in which epitaxial layers 12 and 13, along with a portion of substrate 11 have a narrower cross sectional profile than does the remainder of the substrate 11. In this configuration, individual diodes, which are commonly manufactured in large groups adjacent one another, can be separated without damaging the epitaxial layers, or affecting of the p-n junction, or otherwise changing the quality of the crystal structure. Additionally, the size of the die can be adjusted to handle various current requirements.

As illustrated in FIG. 2, in one embodiment epitaxial layers 12 and 13 and ohmic contact 15 are generally circular in shape. The resulting circular p-n junction avoids the field effect and charge concentration problems that result from other geometries. Additionally, the shape permits passivation, and as stated above, permits diodes to be sawn apart without damaging their junctions. Alternative constructions such as planar diodes are possible, but would require either diffusion or ion implantation in addition to the epitaxial growth techniques of the present invention.

In terms of actual population, the rectifying diode of the present invention can be formed so as to have a desired breakdown voltage. The characteristics for such a diode are set forth in FIG. 13, wherein it can be seen that, for example, where it is desired to design a 100 volt breakdown diode, the required concentration is approximately $2.4 \times 10^{17}$ cm$^{-3}$ and will likewise require a depletion layer width at breakdown of 0.68 microns. Therefore, to prevent the thickness of the epitaxial layer, in this case the n-type layer, from being the limiting parameter for breakdown voltage, one typically exceeds this minimum depletion layer thickness. Thus, for such a 100 volt breakdown diode, the first epitaxial layer 12 should have a thickness on the order of at least 0.68 microns, and a carrier concentration of about $2.4 \times 10^{17}$ cm$^{-3}$. The substrate would have a carrier concentration of approximately one order of magnitude greater; while the second epitaxial layer 13 would have a carrier concentration about the same order of magnitude as the substrate. As set forth herein, the solid line portions of FIG. 13 represent relationships based upon measured data, while the dotted portions represent the expected extrapolations from the measured relationships.

Figure 13:
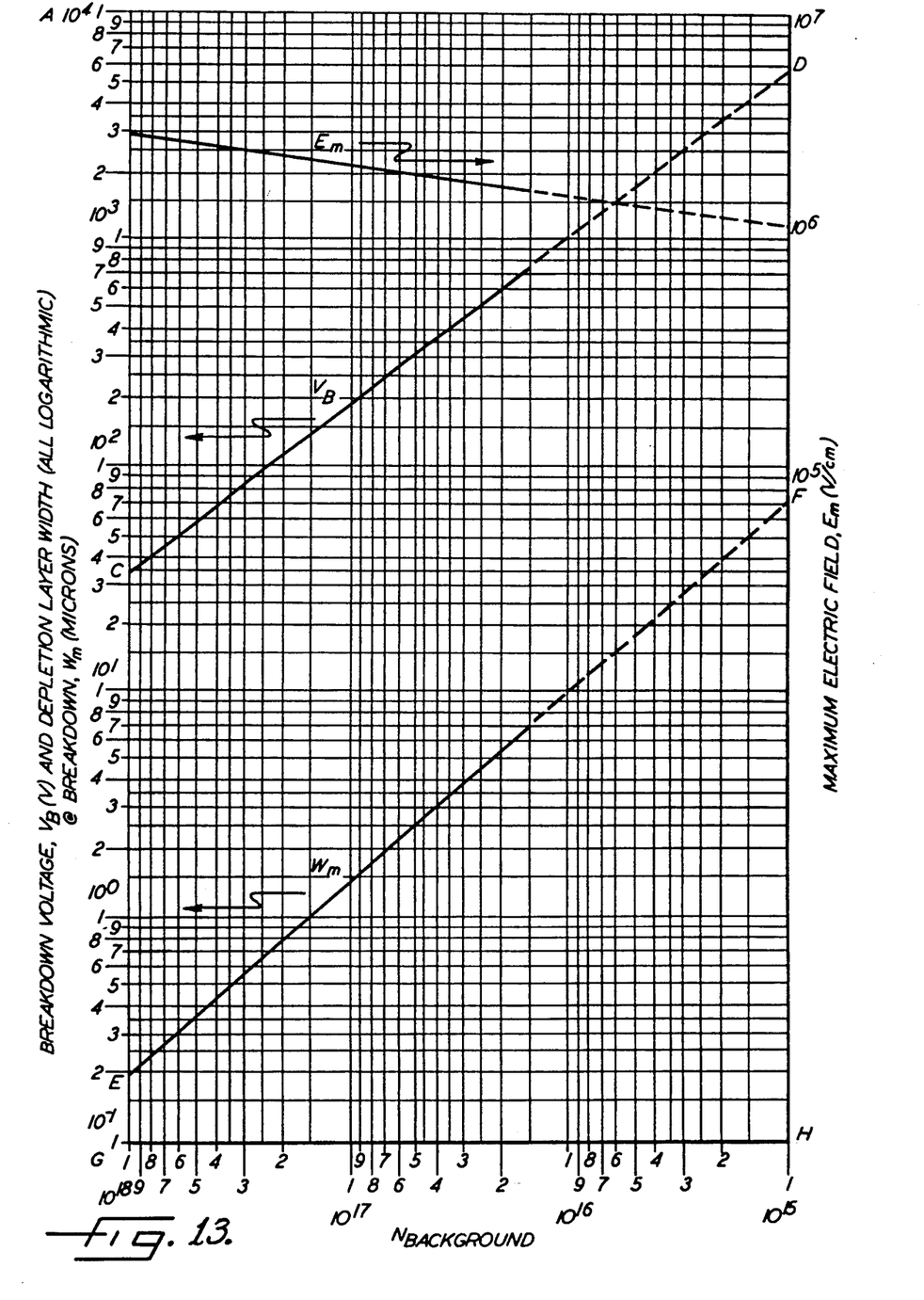
FIG. 13 is a combined plot developed from measured and expected values for reverse breakdown voltage, depletion layer width at breakdown, carrier concentration, and maximum electric field for diodes of the present invention.

In particular, a rectifying diode according to the present invention will have a breakdown voltage (in volts) selected from along line AG of FIG. 13 and which defines a directly opposite horizontal point on line CD. The corresponding depletion layer width (in microns) is selected from the point on line EF of FIG. 13 that falls directly vertically beneath the defined point along line CD and the directly horizontally opposite point along line AG, and a corresponding carrier concentration (atoms/cm$^{-3}$) is selected from the point on line GH of FIG. 13 that falls directly vertically beneath the defined points along line CD and line EF.

The particular structure of the diode of the first embodiment, i.e. with the more densely populated n+preferred substrate, n first epitaxial layer and p+second epitaxial layer, gives a low forward resistance and a high breakdown voltage, and the more densely populated second epitaxial layer 13, likewise tends to give an abrupt p-n junction. The result is a diode with a forward current characteristic of about 200 milliamps at a forward voltage of three volts and a reverse breakdown voltage exceeding 400 volts. Previous diodes, such as the diodes described by Kuroda, demonstrate a forward current of only about 400 microamps at the same 3 volt forward voltage. Similarly, Kuroda's diodes exhibit breakdown at −100 volts. In short the diode of the present invention gives performance approximately 500 times as great in forward bias and four times as great in reverse bias than the prior art diodes.

Figure 5:
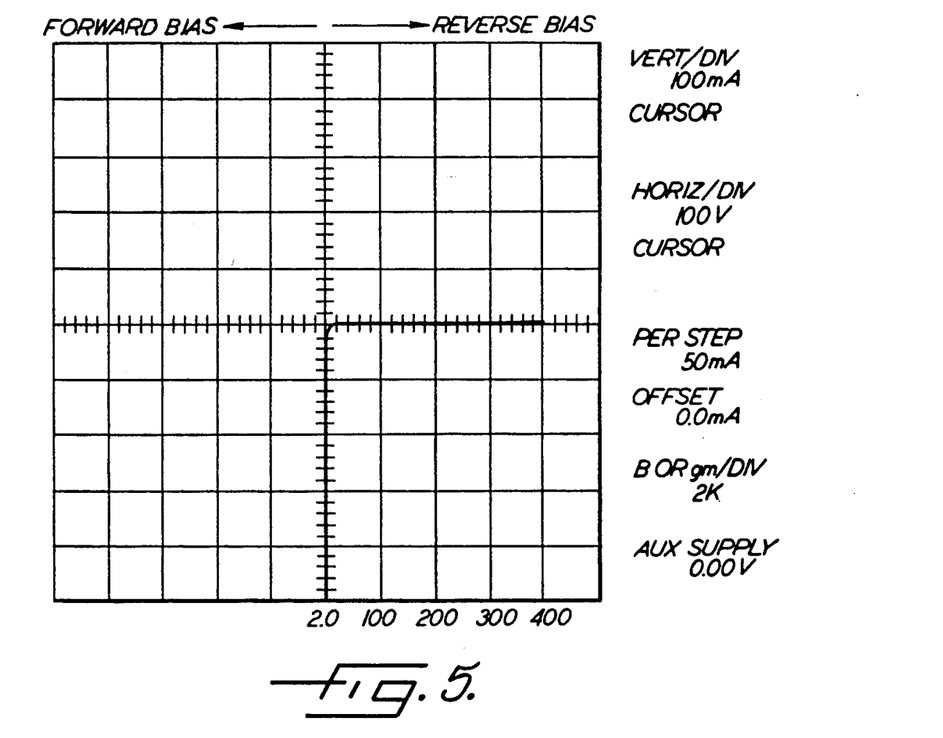
FIG. 5 is a plot of current versus voltage for a rectifying diode according to the present invention highlighting the reverse leakage current at a bias of −400 volts at both room temperature and at 350° C.
Figure 6:
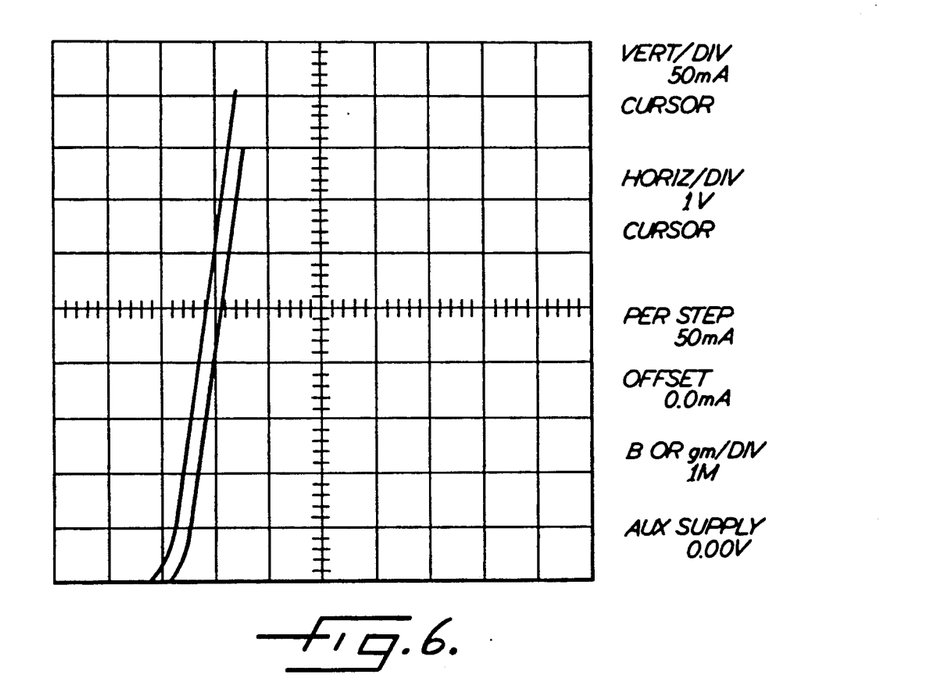
FIG. 6 is a plot of current versus voltage in forward bias highlightng the forward voltage drop to 400 milliamps at room temperature and at 350° C.

These particular results are best illustrated in the plots of FIGS. 5 and 6.

The use of a p+ −n junction in the first embodiment results in the n-type epitaxial layer being the layer of the diode that is predominantly depleted at reverse bias. Nitrogen is a typical preferred n-type dopant and can be characterized as a "shallow" donor, with the result that variation in carrier concentration with temperature——and the resulting electrical characteristics of the diode—are more moderate than for a deeper level dopant. As is known to those familiar with such devices, carrier concentration in the lower doped epitaxial layer essentially controls the reverse bias characteristics of the device. Therefore, the carrier concentration should desirably be kept as constant as possible. As a result, under certain circumstances the lower doped epitaxial layer is preferably n-type over a p-type because the ionization of nitrogen (the typical n-type dopant) varies less with temperature than does that of aluminum (the typical p-type dopant).

Another reason for the particular structure of the first embodiment is the ability to avoid the high resistivity of a p+ substrate as compared to the more favorable lower resistivity of the n+ substrate. Furthermore the p+ character of the epitaxial layer desirably encourages depletion in the n epitaxial layer. Because the diodes of the present invention are formed from silicon carbide, they are successfully operated at greater temperatures than semiconductor devices formed of other materials such as silicon can typically operate. For example, FIG. 5 also shows that a rectifying diode according to the present invention exhibits a reverse leakage current no greater than 80 microamps at −400 volts while operating at a temperature of 350° C. FIG. 6 shows the forward bias characteristics of the same diode at both 25° C. and 350° C.

FIGS. 3 and 4 illustrate another embodiment of the present invention in which the n-type epitaxial layer has the greater carrier concentration, and the p-type layer is the layer that is resultingly predominantly depleted at reverse bias. FIG. 3 illustrates an n+-type substrate 20 formed of monocrystalline silicon carbide, a first monocrystalline epitaxial layer 21 of silicon carbide upon the substrate 20 and having the same n+-type conductivity, and a second monocrystalline epitaxial layer 22 upon the first epitaxial layer 21 that has an opposite p-type conductivity type from the first epitaxial layer 21. As symbolized by the n+ and p− designations, the first epitaxial layer 21 has a carrier concentration at least an order of magnitude greater than the second epitaxial layer 22 so that the second epitaxial layer 22 is predominantly depleted at reverse bias. In a most preferred embodiment, a third monocrystalline epitaxial layer 23 is upon the second epitaxial layer 22 and has the same p-type conductivity as the second epitaxial layer 22 and preferably has a carrier concentration greater than the carrier concentration of the second epitaxial layer 22 for reducing the contact resistance to the entire diode. As in the earlier embodiments, the Davis-type CVD provides an abrupt p-n junction between the first and second epitaxial layers 21 and 22 respectively.

Although not specifically illustrated for the sake of clarity, the diodes include respective ohmic contacts to the substrate and to the second epitaxial layer, or to the third epitaxial layer where one is present.

It has been found in accordance with the present invention that this embodiment also provides excellent diode characteristics. As stated earlier with respect to the first embodiment, under certain circumstances a p-type layer can be somewhat inappropriate as the layer predominantly depleted at reverse bias because of the greater effect of temperature on the concentration of activated p-type dopants that is theoretically expected. In actuality, however, it has been experimentally determined that the p-type epitaxial layer is somewhat compensated by donor atoms that are otherwise present, so that the population of the p-type layer does not fluctuate as much with temperature as would be theoretically expected.

By using an unintentionally compensated p− layer or an intentionally compensated n− layer as the layer predominantly depleted at reverse bias, a smaller carrier concentration can be achieved in that layer. The smaller carrier concentration in turn provides a higher breakdown voltage for the diode: a highly desireable result. As is known to those familiar with silicon carbide, uncompensated n-type crystals or epitaxial layers cannot be produced with carrier concentrations less than about $1 \times 10^{16}$ cm$^{-3}$. This is generally due to the nature of the CVD growth process and the purity of the source gases used.

These limitations on minimum carrier concentration can be overcome with slight compensation of both n− and p− layers whereby carrier populations as low as $5 \times 10^{14}$ cm$^{-3}$ can be achieved. This results in the higher breakdown voltage described above. In this embodiment, reverse breakdown voltages of as high as −5000 volts are expected over temperature ranges of between −55° C. and 350° C. Similarly, forward current of up to 10 amps at forward voltages of as low as 2.7 volts are possible over temperature ranges of about 20° C. to 350° C. Additionally, the diodes operate with reverse recovery times of less than 20 nanoseconds, and usually less than 10 nanoseconds. Of course, as understood by those familiar with semiconductor diodes, for any particular diode the physical size of the device will limit or permit certain performance characteristics. Thus, larger junctions permit larger current flow at a given rated forward voltage.

It will be understood that although the structure illustrated in FIG. 3 has an n+ substrate and then an n+, p−, p+ epitaxial layer arrangement, the diode could similarly include a p+ substrate and first epitaxial layer, and then n− and n+ epitaxial layers with the alternative advantages already described when the n-type layer is predominantly depleted at reverse bias.

FIG. 4 shows an alternative, hexagonal geometry for the diodes of the present invention. The hexagonal geometry offers alternative advantages with respect to the circular mesa diode illustrated in FIG. 2. Although the hexagonal geometry does present corners, they are relatively shallow. Moreover, the hexagonal geometry presents a larger junction area for the same size die and is simpler to package in a glass-encapsulated device.

Figure 14:
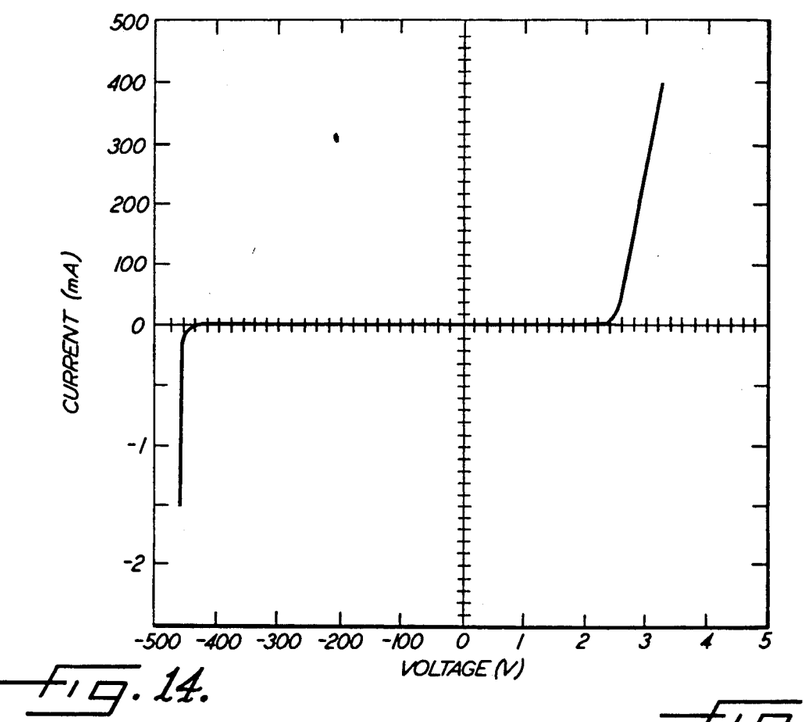
FIGS. 14 and 15 are plots of current versus voltage for another diode according to the present invention and operating at room temperature and 350° C. respectively.
Figure 15:
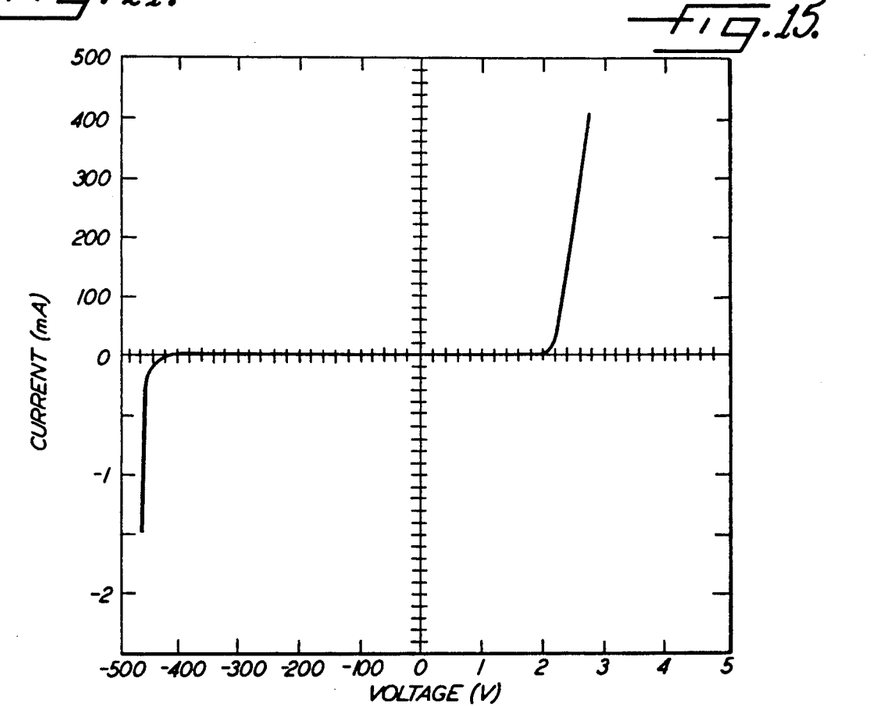

FIGS. 14 and 15 demonstrate some additional characteristics of the diodes of the present invention formed in 6H-SiC and measured and plotted as current versus voltage (I-V) at room temperature (FIG. 14) and 350° C. (FIG. 15). The particular device had an n+ substrate, an n+ first epitaxial layer, a p− second epitaxial layer, and a p+ third epitaxial layer. At room temperature a peak inverse voltage (PIV) of 455 volts (V) is reached whereupon avalanche breakdown occurs. The breakdown initially occurs at about 420V with a reverse leakage current of 4 microamps, increasing to 50 microamps at 450V. Thereafter the device operates in avalanche with current increasing linearly with voltage. The right hand side of FIG. 14 illustrates the forward bias characteristics of this device. The bandgap of 6H-SiC is about 2.9 electron-volts (eV) at room temperature. This gives a built-in junction potential, corresponding to the turn-on voltage of the diode, in the range of about 2.4 to 2.5 V. Thereafter, current rapidly increases with voltage, limited by the series resistance of the SiC. In other words, if resistance were totally absent (a practical impossibility), the current would be unlimited, but the turn-on voltage would remain in the 2.4 to 2.5 V range at room temperature.

FIG. 15 shows the current-voltage characteristics of the diode operating at 350° C. In reverse bias the breakdown voltage remains the same. The pre-breakdown voltage, however, characterized by the rounded knee in the curve between −400 and −450V, increases slightly. This increase may be due to thermally generated carriers other than those that contribute to the reverse saturation current ($J_s$) of the diode. At 350° C., $J_s$ is about $10^{-14}$ amps/cm$^2$.

When the diode is heated to 350° C., the turn-on voltage decreases to about 2.0 V. This decrease in voltage with increased temperature may be a result of the reduction in bandgap of the material and thus an increase in the intrinsic carrier concentration.

Figure 7:
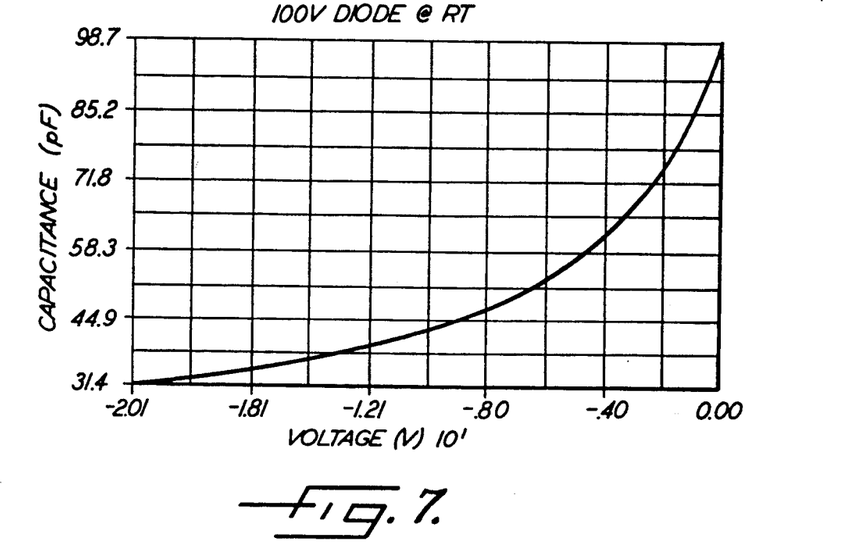
FIG. 7 shows the relationship between capacitance and reverse bias voltage to −20 volts for a diode according to the present invention.
Figure 8:
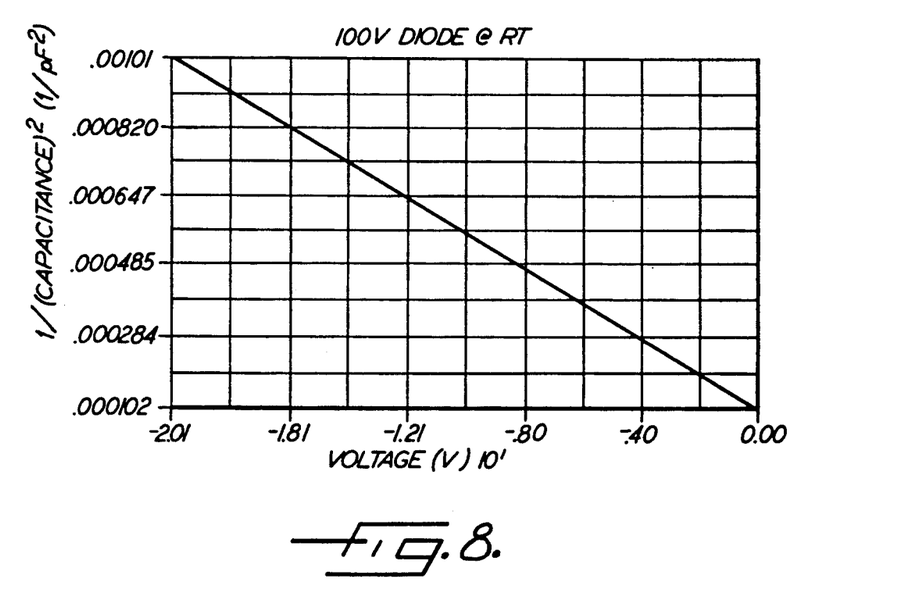
FIG. 8 is a plot of the reciprocal of capacitance squared versus gate voltage for a diode of the present invention and showing the linear relationship therebetween.

FIGS. 7 and 8 demonstrate the characteristics of the abrupt junctions in the diodes formed according to the present invention. FIG. 7 is a plot of capacitance taken directly against applied voltage and shows the nonlinear, but proportional increase of capacitance as voltage becomes more positive. More importantly, FIG. 8 shows that when the reciprocal of capacitance squared is plotted against the applied voltage, a substantially linear relationship is developed which demonstrates that the junction is abrupt rather than graded. As discussed earlier with respect to prior devices, where the reciprocal of capacitance squared plotted against voltage remains nonlinear and instead the reciprocal of capacitance cubed plotted against voltage becomes linear, the junction is graded, a situation which results in a lower breakdown voltage device and a diode which cannot operate as quickly.

Figure 9:
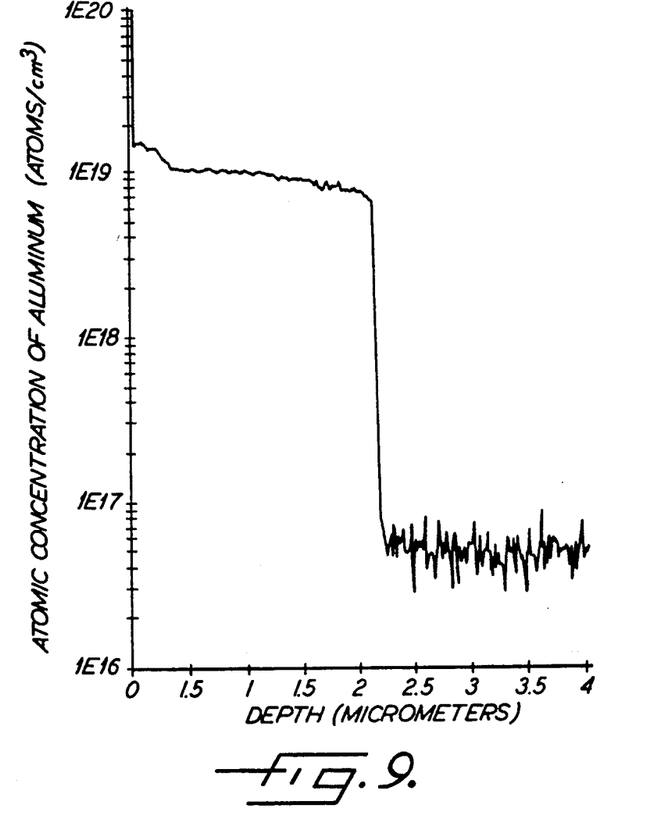
FIG. 9 is a plot of the atomic concentration of aluminum versus depth as determined by secondary ion mass spectrometry (SIMS) for a diode according to the present invention.
Figure 10:
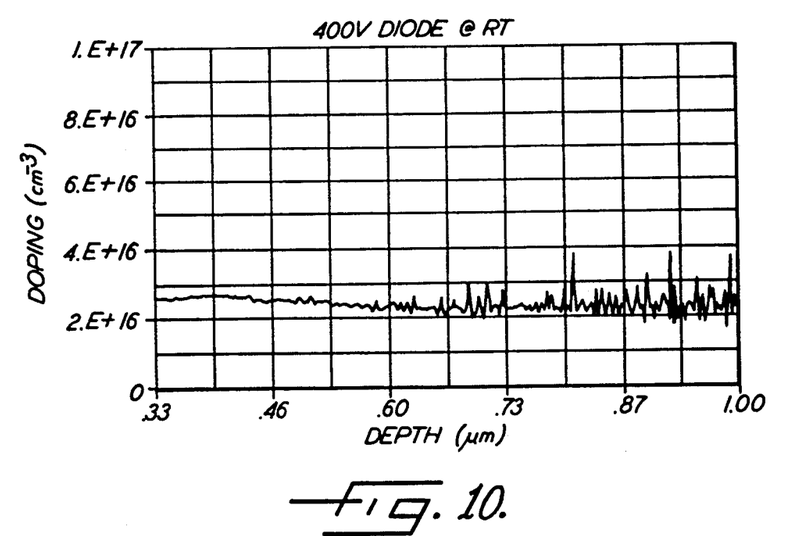
FIG. 10 is a plot of carrier concentration of donors versus depth (depleted to −20 volts reverse bias) in the n-type layer as determined by capacitance-voltage measurements for a 400 volt diode according to the present invention.

FIG. 9 shows the results of another measurement technique that confirms the results demonstrated by FIG. 8. As set forth in the description of the drawings, FIG. 9 is a SIMS plot of the aluminum (acceptor atom in p+epitaxial layer) population and its change as the p-n junction is crossed. The sharp vertical drop shown in the graph indicates that the acceptor atom population changes rapidly and drastically at the junction, giving the diode of the present invention its desired properties. FIG. 10 shows the carrier concentration of the uncompensated n-type epitaxial layer as determined by capacitance-voltage measurements. As shown here and is reflected in FIG. 13, a diode showing a $V_{BR}$ of 580 V results from a carrier concentration of approximately $2.2 \times 10^{16}$ cm$^{-3}$ in the n-type layer.

Diodes formed according to the present invention also demonstrate the ability to operate at high frequencies; i.e. they can rectify a high frequency alternating current. As is known to those familiar with such devices, when reverse bias is applied to a rectifying diode, and the diode operates to block the flow of reverse current, a depletion region is built up adjacent the junction. This region has a certain capacitance which takes time to dissipate after the reverse bias is removed and the forward bias is applied.

Figure 11:
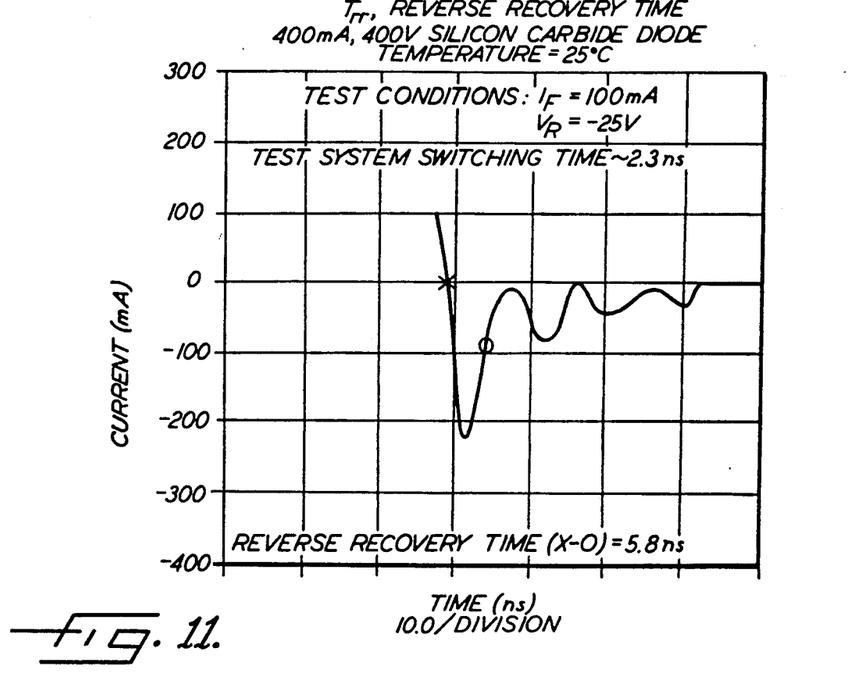
FIGS. 11 and 12 show the relationship between current and time in a switching circuit demonstrating reverse recovery time for a diode according to the present invention operating at room temperature and 350° C. respectively.
Figure 12:
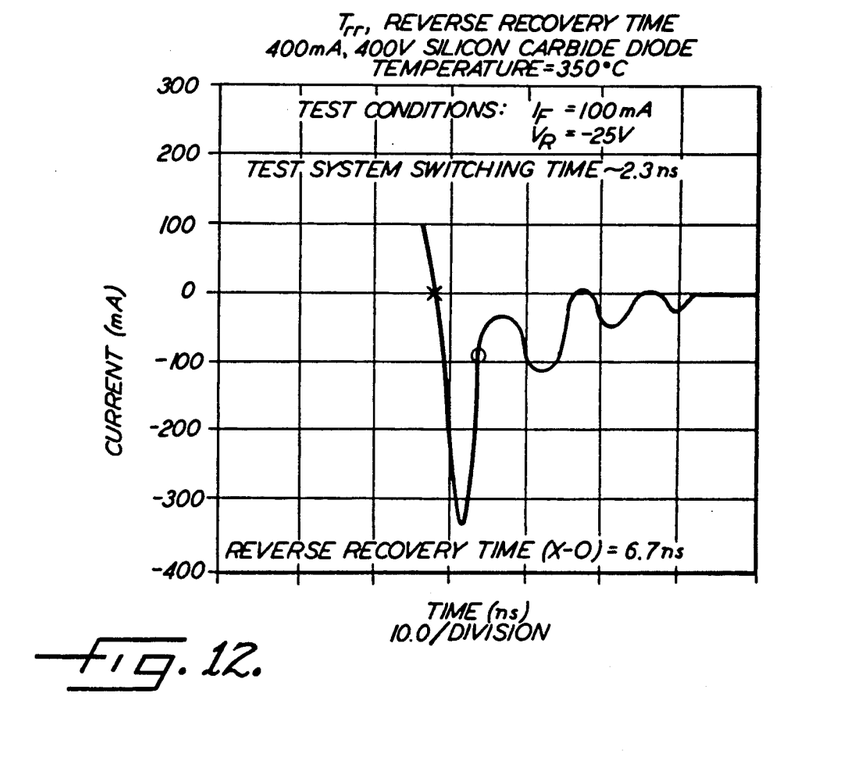

This time period is known as the reverse recovery time ($t_{rr}$). In silicon carbide, the minority carrier lifetime is very low and therefore reverse recovery time, which is directly proportional to minority carrier lifetime, should be very short. Nevertheless, prior to the present invention, rectifying p-n junctions good enough to provide a measurable reverse recovery time had never been demonstrated. As illustrated graphically in FIGS. 11 and 12, the rectifying diodes of the present invention, however, have demonstrated sufficient quality to permit experimental measurement of reverse recovery time data. Maximum reverse recovery times as short as between about 5 and 8 nanoseconds maximum have been determined. Similar performance at even higher temperatures is correspondingly expected. Typically, in silicon, a rectifying diode with reverse recovery time of 100 to 200 nanoseconds would be considered fast. Schottky diodes are somewhat faster, but are limited in reverse bias to approximately −200 volts. Thus, the reverse recovery time is a characteristic of any given specific device. Diodes formed according to the present invention have consistently been demonstrated to have reverse recovery times less than 10 nanoseconds.

The rectifying diodes of the present invention are formed according to the incorporated disclosures of Davis et al set forth earlier herein describing a successful chemical vapor deposition method for growing silicon carbide epitaxial layers on off-axis silicon carbide substrates. For the sake of definition and clarity, the chemical vapor deposition techniques disclosed in the incorporated references are referred to as "Davis-type" chemical vapor deposition. In the diodes that are produced using Davis-type CVD the substrate comprises alpha silicon carbide and has a flat interface surface that is inclined more than one degree off axis with respect to a basal plane thereof substantially towards one of the $<11\bar{2}0>$ directions. The first epitaxial layer also comprises alpha silicon carbide and is homoepitaxially deposited on the substrate interface surface.

Because epitaxial layers can be doped while being grown, they do not require implantation, and the crystal damage that can result from implantation can be avoided. Furthermore, implantation techniques would not permit adjacent n and n+ or p and p+ layers. An n+ layer could be implanted on an n layer, but an n layer could not be implanted on an n+ layer without compensation (i.e the presence of active amounts of both donor and acceptor atoms) of the n+ layer.

Additionally, CVD growth allows thickness control which to some extent allows control of the resulting depletion layer and thus, effects breakdown voltage. Finally, crystal characteristics of epitaxial layers are generally better structurally and carry less impurities than do bulk growth layers.

In the embodiments discussed herein, the illustrative data have been gathered from diodes formed from alpha type 6H silicon carbide. Other polytypes, however, can be prepared as the epitaxial layers and substrates and have characteristic advantages. For example, the 4H, 15R and 3C polytypes can all be fashioned into diodes according to the present invention. The 6H polytype has a wide band gap, is therefore expected to perform at high temperatures, and is most commonly produced in bulk form. The 4H polytype has the highest band gap (3.2 eV), shallower aluminum and nitrogen doping levels, and a greater electron mobility than the 6H polytype. The 3C polytype likewise has a higher electron mobility than does the 6H and a shallower band gap and corresponding lower built in potential for a p-n junction. Finally, the 15R polytype has a lower activation energy for nitrogen dopant than does the 6H polytype, along with a higher electron mobility.

As will be understood by those familiar with rectifying diodes and their manufacture and properties, once a particular set of characteristics are established, the manufacture of diodes having wide ranging properties can be accomplished. Therefore, the properties of diodes according to the present invention having been demonstrated, it is expected that diodes having reverse breakdown voltages as great as −5000 volts are possible as part of the present invention. Such diodes are expected to exhibit such properties at temperature ranges extending from about −55° C. to at least 350° C. Selected embodiments of the diodes will exhibit reverse leakage currents no greater than 25 microamps up to their given rated reverse breakdown voltages. In other embodiments reverse leakage currents no greater than 100 microamps will be exhibited at temperatures up to 350° C., and particular embodiments have demonstrated reverse leakage currents no greater than 8 microamps at −400 volts at 25° C.

Forward currents of 400 milliamps at 2.9 volts at a temperature of 350° C. have been demonstrated. At room temperature (25° C.) forward currents of 400 milliamps at 3.2 volts are typically observed, and 400 milliamp current at as low as 2.7 volts has also been observed.

Reverse recovery times less than 200 nanoseconds have been demonstrated, as have $t_{rr}$'s of less than 100, 20, and 10 nanoseconds, and as set forth earlier herein specific embodiments have demonstrated reverse recovery times less than 6 nanoseconds at 25° C. and less than 7 nanoseconds at 350° C.

It will be understood that such rectifying diodes are characteristically rated by their maximum exemplary performance values. Thus, diodes according to the present invention, and the claims set forth hereinafter, also cover otherwise similar and equivalent diodes which may exhibit somewhat less than the various exemplary characteristics set forth herein.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which I claim is:

1. A fast recovery, high temperature rectifying diode formed in silicon carbide and comprising
   a monocrystalline silicon carbide substrate having a sufficient carrier concentration to give said substrate a first conductivity type;
   a first monocrystalline epitaxial layer of silicon carbide upon said substrate and having the same conductivity type as said substrate;

a second monocrystalline epitaxial layer of silicon carbide upon said first epitaxial layer and having the opposite conductivity type from said first epitaxial layer;

said first and second epitaxial layers having respective carrier concentrations that differ in magnitude by an amount sufficient so that the layer having the lesser concentration is predominantly depleted in reverse bias, with dais lesser concentration being between about $1 \times 10^{15}$ and $1 \times 10^{18}$ atoms per cubic centimeter ($cm^{-3}$), and said layer having said lesser carrier concentration further having a minimum thickness of between about 0.2 microns at about $1 \times 10^{18}$ $cm^{-3}$ and about 70 microns at about $1 \times 10^{15}$ $cm^{-3}$ so that said minimum thickness is sufficient to achieve avalanche breakdown under reverse bias; and a rectifying p-n junction formed between said first and second epitaxial layers.

2. A rectifying diode according to claim 1 wherein said first epitaxial layer has a carrier concentration greater than said second epitaxial so that said second epitaxial layer is predominantly depleted in reverse bias.

3. A rectifying diode according to claim 1 wherein said substrate and said first epitaxial layer have n-type conductivity.

4. A rectifying diode according to claim 1 wherein said substrate and said first epitaxial layer have p-type conductivity.

5. A rectifying diode according to claim 1 and further comprising a third epitaxial layer upon said second epitaxial layer and wherein said third epitaxial layer has the same conductivity type as said second epitaxial layer and has a carrier concentration sufficiently greater than said second epitaxial layer to reduce the contact resistance to said diode.

6. A rectifying diode according to claim 1 wherein said silicon carbide substrate comprises of alpha silicon carbide and has a flat interface surface that is inclined more than one degree off axis with respect to a basal plane thereof substantially towards one of the $<11\bar{2}0>$ directions, and with said first epitaxial layer comprising alpha silicon carbide homoepitaxially deposited on said substrate interface surface.

7. A rectifying diode according to claim 1 further comprising an ohmic contact to said substrate and an ohmic contact to said second epitaxial layer.

8. A rectifying diode according to claim 5 further comprising an ohmic contact to said substrate and an ohmic contact to said third epitaxial layer.

9. A rectifying diode according to claim 1 an further comprising a passivation layer adjacent said junction.

10. A rectifying diode according to claim 9 wherein said passivation layer comprises a thermally grown silicon dioxide.

11. A fast recovery, high temperature rectifying diode formed in silicon carbide and comprising:

a monocrystalline silicon carbide substrate having a sufficient carrier concentration to give said substrate a first conductivity type;

a first monocrystalline epitaxial layer of silicon carbide upon said substrate and having the same conductivity type as said substrate; and a second monocrystalline epitaxial layer of silicon carbide upon said first epitaxial layer and having the opposite conductivity type from said first epitaxial layer and having a carrier concentration greater than the carrier concentration of said first monocrystalline epitaxial layer so that said first epitaxial layer is predominantly depleted in reverse bias, with said carrier concentration of said first layer being between about $1 \times 10^{15}$ and $1 \times 10^{18}$ atoms per cubic centimeter ($cm^{-3}$), and said first layer further having a minimum thickness of between about 0.2 microns at about $1 \times 10^{18}$ $cm^{-3}$ and about 70 microns at about $1 \times 10^{15}$ $cm^{-3}$ so that said minimum thickness is sufficient to achieve avalanche breakdown under reverse bias; and an abrupt rectifying p-n junction formed between said first and second epitaxial layers.

12. A rectifying diode according to claim 11 wherein said substrate is formed of n-type alpha silicon carbide, said first epitaxial layer is formed of n-type alpha silicon carbide, and said second epitaxial layer is formed of p-type alpha silicon carbide.

13. A rectifying diode according to claim 11 wherein said first monocrystalline epitaxial layer has a carrier concentration less than the carrier concentration of said substrate.

14. A rectifying diode according to claim 11 further comprising an ohmic contact to said substrate and an ohmic contact to said second epitaxial layer.

15. A rectifying according to claim 14 wherein said ohmic contact to said substrate comprises nickel and said ohmic contact to said second epitaxial layer comprises a bimetallic contact containing aluminum.

16. A rectifying diode according to claim 14 wherein said ohmic contact to said second epitaxial layer comprises aluminum.

17. A rectifying diode according to claim 11 wherein said silicon carbide has a single polytype selected from the group consisting of the 6H, 3C, 4H, and 15R polytypes.

18. A rectifying diode according to claim 11 wherein the relationship between applied voltage and capacitance is such that the relationship between the reciprocal capacitance squared and the applied voltage is a substantially linear relationship.

19. A rectifying diode according to claim 11 having a reverse breakdown voltage as high as $-5000$ volts while operating at a temperature range of between $-55°$ C. and 350° C.

20. A rectifying diode according to claim 11 having a forward current of at least 400 milliamps at a forward voltage of as low as 2.7 volts while operating at a temperature of 25° C.

21. A rectifying diode according to claim 11 having a forward current of at least 400 milliamps at a forward voltage of as low as 2.2 volts while operating at a temperature of 350° C.

22. A rectifying diode according to claim 11 having a forward current of up to 10 amps at forward voltages as low as 2.7 volts over at a temperature range of about 20° C. to about 350° C.

23. A rectifying diode according to claim 11 having a reverse leakage current no greater than 25 microamps up to a given rated reverse breakdown voltage while operating at a temperature of 25° C.

24. A rectifying diode according to claim 11 having a reverse leakage current no greater than 100 microamps up to a given rated reverse breakdown voltage while operating at a temperature of 350° C.

25. A rectifying diode according to claim 11 having a reverse leakage current no greater than 8 microamps at $-400$ volts while operating at a temperature of 25° C.

26. A rectifying diode according to claim 11 having a reverse leakage current no greater than 80 microamps at −400 volts while operating at a temperature of 350° C.

27. A rectifying diode according to claim 11 having a reverse recovery time less than 200 nanoseconds.

28. A rectifying diode according to claim 11 having a reverse recovery time less than 100 nanoseconds.

29. A rectifying diode according to claim 11 having a reverse recovery time less than 20 nanoseconds.

30. A rectifying diode according to claim 11 having a reverse recovery time less than 10 nanoseconds.

31. A rectifying diode according to claim 11 having a reverse recovery time as small as 6 nanoseconds or less at an operating temperature of 25° C.

32. A rectifying diode according to claim 11 having a reverse recovery time as small as 7 nanoseconds or less at an operating temperature of 350° C.

33. A fact recovery, high temperature rectifying diode formed in silicon carbide and comprising:
  a monocrystalline silicon carbide substrate having a sufficient carrier concentration to give said substrate a first conductivity type;
  a first monocrystalline epitaxial layer of silicon carbide upon said substrate and having the same conductivity type as said substrate; and
  a second monocrystalline epitaxial layer of silicon carbide upon said first epitaxial layer and having the opposite conductivity type from said first epitaxial layer;
  said first epitaxial layer having a carrier concentrate greater than said second epitaxial layer by an amount sufficient so that said second epitaxial layer is predominantly depleted at reverse bias, with said carrier concentration of said second layer being between about $1 \times 10^{15}$ and $1 \times 10^{18}$ atoms per cubic centimeter ($cm^{-3}$), and said second layer further having a minimum thickness of between about 0.2 microns at about $1 \times 10^{18}$ $cm^{-3}$ and about 70 microns at about $1 \times 10^{15}$ $cm^{-3}$ so that said minimum thickness is sufficient to achieve avalanche breakdown under reverse bias;
  a third monoepitaxial layer upon said second epitaxial layer and having the same conductivity type as said second epitaxial layer and having a carrier concentration greater than said second epitaxial layer for reducing the contact resistance to said diode; and
  an abrupt rectifying p-n junction formed between said first and second epitaxial layers.

34. A rectifying diode according to claim 33 wherein said substrate and said first epitaxial layer comprise n-type alpha silicon carbide, and said second and third epitaxial layers comprise p-type alpha silicon carbide.

35. A rectifying diode according to claim 33 having a reverse breakdown voltage as high as −5000 volts while operating at a temperature range of between −55° C. and 350° C.

36. A rectifying diode according to claim 33 having a forward current of up to 10 amps at forward voltages as low as 2.7 volts over a temperature range of about 20° C. to about 350° C.

37. A rectifying diode according to claim 33 having a reverse leakage current no greater than 100 microamps up to a given rated reverse breakdown voltage while operating at a temperature of 350° C.

38. A rectifying diode according to claim 33 having a reverse recovery time less than 20 nanoseconds.

39. A rectifying diode according to claim 33 and further comprising an ohmic contact to said substrate and an ohmic contact to said third epitaxial layer.

* * * * *

UNITED STATES PATENT AND TRADEMARK OFFICE
CERTIFICATE OF CORRECTION

PATENT NO. : 5,061,972
DATED : October 29, 1991
INVENTOR(S) : John A. Edmond

It is certified that error appears in the above-identified patent and that said Letters Patent is hereby corrected as shown below:

ON THE COVER PAGE:

"9 Drawing Sheets" should be --7 Drawing Sheets--.

At column 2, line 1, "qenerally" should be --generally--.

At column 3, line 12, "This" should be --Thin--.

At column 3, line 21, "4,866,065" should be --4,866,005--.

At column 3, line 40, please insert a period after the word "junction".

At column 5, line 22, "highlightng" should be --highlighting--.

At column 6, line 46, "maqnitude" should be --magnitude--.

UNITED STATES PATENT AND TRADEMARK OFFICE
CERTIFICATE OF CORRECTION

PATENT NO. : 5,061,972
DATED : October 29, 1991
INVENTOR(S) : John A. Edmond

It is certified that error appears in the above-indentified patent and that said Letters Patent is hereby corrected as shown below:

At column 6, line 62, "Can" should be --can--.

At column 13, line 51, "an" should be --and--.

Signed and Sealed this

Tenth Day of August, 1993

Attest:

MICHAEL K. KIRK

Attesting Officer     Acting Commissioner of Patents and Trademarks